(12) United States Patent
Ko

(10) Patent No.: US 10,490,709 B2
(45) Date of Patent: Nov. 26, 2019

(54) BACKLIGHT APPARATUS

(71) Applicant: Real Optronics Corporation, Taoyuan (TW)

(72) Inventor: Chun-Min Ko, Taichung (TW)

(73) Assignee: REAL OPTRONICS CORPORATION, Zhongli Dist., Taoyuan (TW)

(\*) Notice: Subject to any disclaimer, the term of this patent is extended or adjusted under 35 U.S.C. 154(b) by 0 days.

(21) Appl. No.: 16/127,700

(22) Filed: Sep. 11, 2018

(65) Prior Publication Data

US 2019/0097097 A1  Mar. 28, 2019

(30) Foreign Application Priority Data

Sep. 27, 2017 (TW) .............................. 106133122 A

(51) Int. Cl.
| | | |
|---|---|---|
| H01L 33/50 | (2010.01) | |
| G02F 1/1335 | (2006.01) | |
| H01L 33/52 | (2010.01) | |
| H01L 25/075 | (2006.01) | |
| H01L 33/58 | (2010.01) | |
| H01L 33/62 | (2010.01) | |

(52) U.S. Cl.
CPC ...... *H01L 33/504* (2013.01); *G02F 1/133603* (2013.01); *G02F 1/133606* (2013.01); *H01L 25/0753* (2013.01); *H01L 33/505* (2013.01); *H01L 33/52* (2013.01); *G02F 2001/133607* (2013.01); *G02F 2001/133614* (2013.01); *H01L 33/507* (2013.01); *H01L 33/58* (2013.01); *H01L 33/62* (2013.01)

(58) Field of Classification Search
None
See application file for complete search history.

(56) References Cited

U.S. PATENT DOCUMENTS

2017/0198149 A1\* 7/2017 Yamada .................... B32B 7/12
2019/0183059 A1\* 6/2019 Yun ........................ A01G 7/045

\* cited by examiner

*Primary Examiner* — Dung A. Le
(74) *Attorney, Agent, or Firm* — Muncy, Geissler, Olds & Lowe, PC

(57) ABSTRACT

The invention discloses a backlight apparatus including a wavelength-converting device and a light source. The wavelength-converting device includes a transparent upper barrier film, a transparent lower barrier film, a spacer layer, a filling material and a plurality of quantum dots. The spacer layer is bonded between the transparent upper barrier film and the transparent lower barrier film, and has a plurality of hollowed regions. The filling material covers the plurality of hollowed regions. The plurality of quantum dots are uniformly distributed in the filling material covering each hollowed region. The light source includes a circuit board and a plurality of semiconductor light-emitting device. The circuit board is disposed beneath the transparent lower barrier film. Each hollowed region corresponds to at least one semiconductor light-emitting device. Each semiconductor light-emitting device is electrically bonded on the circuit board, and locates beneath the corresponding hollowed region.

10 Claims, 6 Drawing Sheets

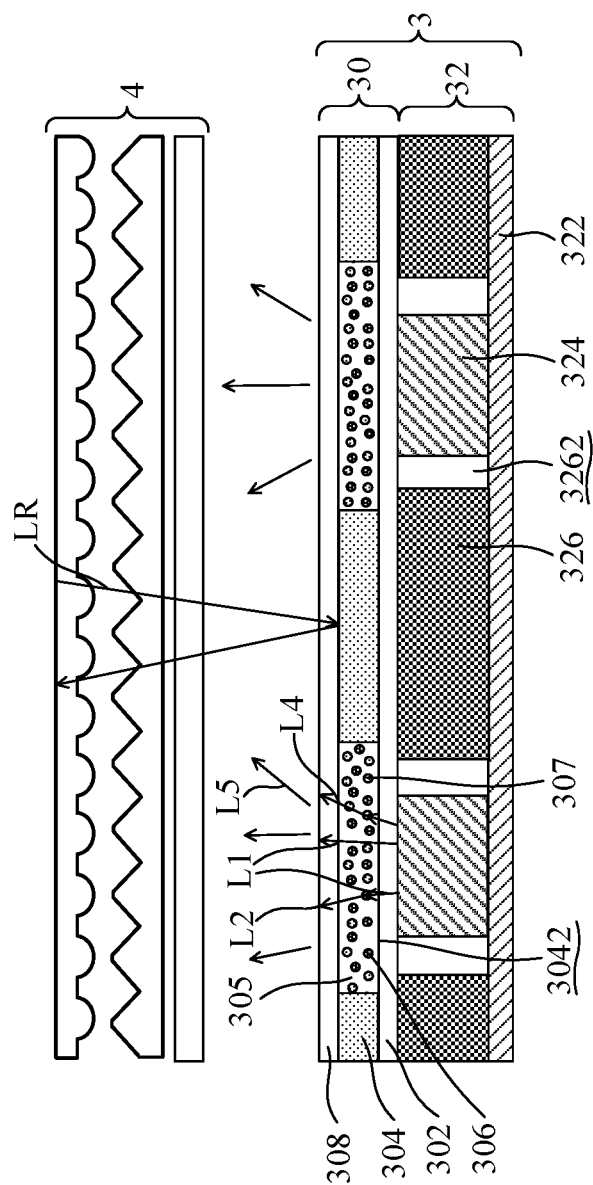

BACKLIGHT APPARATUS

CROSS-REFERENCE TO RELATED APPLICATION

This utility application claims priorities to Taiwan Application Serial Number 106133122, filed Sep. 27, 2017, which is incorporated herein by reference.

BACKGROUND OF THE INVENTION

1. Field of the Invention

The invention relates to a backlight apparatus, and in particular, to a backlight apparatus using in a small amount of quantum dots and having no color deviation of the light eventually emitted.

2. Description of the Prior Art

It is well known that liquid crystal display systems display images by means of a liquid crystal panel. However, since the liquid crystal panel itself does not emit light, it is necessary to achieve a light-emitting function by a so-called backlight apparatus, and thus the backlight apparatus is an important component of the liquid crystal display system.

Most of the current backlight apparatuses use packaged semiconductor light emitting diodes as light sources. These light source are, according to their architectures, roughly divided into direct illumination type backlight apparatuses and side-edge light type backlight apparatuses. The direct illumination type backlight apparatus has the advantages of high light extraction efficiency, no need for a light-guiding plate, fewer components etc., but also has the disadvantages of low light uniformity and thick module etc. The direct illumination type backlight apparatuses are divided into two types. The first type of direct illumination type backlight apparatus directly aligns the light-emitting diodes in the light box. The main structure of the side-edge light type backlight apparatus is composed of an illuminating source, a light-guiding plate, optical films (for example, prism films, diffusion films, reflection films, and so on), a reflection cover for the illuminating source, and external members (for example, a bezel and son on).

At present, the backlight apparatus of the liquid crystal display system uses quantum dots to improve the quality of the display. Quantum dots are semiconductors in the form of nanocrystals that provide an alternative display. The electronic characteristics of the quantum dots are generally governed by the size and shape of the nanocrystals. Quantum dots of the same material, but with different sizes, can emit light of different colors when excited. More specifically, the emission wavelength of the quantum dots varies with a size and shape of the quantum dots. As one example, larger quantum dots may emit longer wavelength light, such as red light while smaller quantum dots may emit shorter wavelength light, such as blue light or violet light. For example, quantum dots formed from cadmium selenide (CdSe) may be gradually tuned to emit light from the red region of the visible spectrum for a 5 nm diameter quantum dot, to the violet region for a 1.5 nm diameter quantum dot. By varying quantum dot size, the entire visible wavelength, ranging from about 460 nm (blue) to about 650 nm (red), may be reproduced.

The quantum dot technology is applied to a liquid crystal display system, which can greatly improve the color gamut and color vividness of the liquid crystal display system, and reduce energy consumption. The liquid crystal display system using quantum dot technology can be combined with the direct illumination type backlight full array local dimming technology to obtain higher dynamic contrast and more details of the bright and dark parts to achieve a realistic display effect.

Referring to FIG. 1, FIG. 1 schematically illustrates with a local cross-sectional view the architecture of a direct illumination type backlight apparatus 1 using quantum dots of a prior art.

As shown in FIG. 1, the direct illumination type backlight apparatus 1 includes a wavelength-converting device 10 and a light source 12. Optical films 2 disposed above the direct illumination type backlight apparatus 1 are also shown in FIG. 1. The optical films can include prism films, diffusion films, reflection films and so on.

The wavelength-converting device 10 includes a transparent lower barrier film 102, a transparent intermediate layer 104, a plurality of quantum dots 106, and a transparent upper barrier film 108. The plurality of quantum dots 106 are uniformly distributed in the transparent intermediate layer 104. The transparent intermediate layer 104 is bonded on the transparent lower barrier film 102. The transparent upper barrier film 108 is bonded on the transparent intermediate layer 104.

The light source 12 includes a circuit board 122 and a plurality of semiconductor light-emitting device 124. The circuit board 122 is disposed beneath the transparent lower barrier film 102. The plurality of semiconductor light-emitting device 124 are arranged in an array on the circuit board 122 and are electrically bonded on the circuit board 122.

Obviously, the direct illumination type backlight apparatus 1 of the prior art uses a large amount of quantum dots 106, and the overall cost of the direct illumination type backlight apparatus 1 is very high.

In addition, the direct illumination type backlight apparatus 1 of the prior art has a small distance between the wavelength-converting device 10 and the optical films 2, but a large distance between the wavelength-converting device 10 and the light source 12. After the light emitted by the light source 12 passes through the wavelength-converting device 10, a portion of the light is reflected by the optical films 2 through the wavelength-converting device 10, and then reflected again through the wavelength-converting device 10, and even the portion of the light emitted by the light source 12 may pass through the wavelength-converting device 10 repeatedly. The iterative passing of the portion of the light through the wavelength-converting device 10 causes that the color of the light eventually passing through the optical films 2 is biased toward the color of the light which original light is converted by the quantum dots 106 into. The effect of the structures of different optical films 2 on the white point coordinates is different, and thus, the color deviation resulted from the effect needs to be resolved by adjusting the proportion of quantum dots.

SUMMARY OF THE INVENTION

Accordingly, one scope of the invention is to provide a backlight apparatus using less quantum dots. The backlight apparatus according to the invention uses a small amount of quantum dots such that the overall cost of the backlight apparatus to the invention is low. The backlight device according to the invention has no color deviation caused by the backlight apparatus of the prior art.

A backlight apparatus according to a preferred embodiment of the invention includes a wavelength-converting device and a light source. The wavelength-converting device includes a transparent upper barrier film, a transparent lower barrier film, a first spacer layer, a filling material and a plurality of first quantum dots. The light source includes a circuit board and a plurality of semiconductor light-emitting devices. The first spacer layer is bonded on the transparent lower barrier film, and has a plurality of first hollowed regions. The filling material covers the plurality of first hollowed regions. The plurality of first quantum dots are uniformly distributed in the filling material covering each first hollowed region. The circuit board is disposed beneath the transparent lower barrier film. Each first hollowed region corresponds to at least one semiconductor light-emitting device. Each semiconductor light-emitting device is electrically bonded on the circuit board, and locates beneath the corresponding first hollowed region. Each semiconductor light-emitting device emits a first color light passing through the filling material covering the corresponding first hollowed region. The first quantum dots distributed in the filling material covering each fist hollowed region absorb a first portion of the first color light passing through the filling material, and convert the absorbed first portion of the first color light into a second color light. The second color light is blended with other portion of the first color light into a third color light propagating toward the transparent upper barrier film.

Further, the backlight apparatus according to the invention also includes a second spacer layer. The second spacer layer is mounted on the circuit board, and has a plurality of second hollowed regions. Each second hollowed region corresponds to one of the first hollowed regions, and locates beneath the corresponding first hollowed region. The at least one semiconductor light-emitting device corresponding to each first hollowed region is disposed within the second hollowed region corresponding said one first hollowed region.

Further, the backlight apparatus according to the invention also includes a plurality of first lens devices. Each first lens device corresponds to one of the first hollowed regions, is mounted on the transparent upper barrier film, and locates above the corresponding first hollowed region.

Further, the backlight apparatus according to the invention also includes a plurality of second lens devices. Each second lens device corresponds to one of the second hollowed regions, is disposed within the corresponding second hollowed region, and locates above the semiconductor light-emitting devices in the corresponding second hollowed region.

In one embodiment, the plurality of first quantum dots can be formed of a first group II-VI compound, a fist group III-V compound, a first group IV-VI compound, a first group IV compound, or a mixture therebetween Further, the backlight apparatus according to the invention also includes a plurality of second quantum dots. The plurality of second quantum dots are uniformly distributed in the filling material covering each first hollowed region. The second quantum dots distributed in the filling material covering each first hollowed region absorb a second portion of the first color light passing through said filling material, and convert the absorbed second portion of the first color light into a fourth color light. The fourth color light is blended with the second color light and other portion of the first color light into a fifth color light propagating toward the transparent upper barrier film.

In one embodiment, the plurality of second quantum dots can be formed of a second group II-VI compound, a second group III-V compound, a second group IV-VI compound, a second group IV compound, or a mixture therebetween.

In one embodiment, the first spacer layer can be formed of a transparent polymer material.

In another embodiment, the first spacer layer can be formed of a dark colored polymer material.

In another embodiment, the first spacer layer can be formed of a first light colored polymer material or a first metal sheet.

In one embodiment, the second spacer layer can be formed of a second light colored polymer material or a second metal sheet.

Distinguishable from the prior arts, the backlight apparatus according to the invention uses a small amount of quantum dots, and has no color deviation caused by the backlight apparatus of the prior art.

The advantage and spirit of the invention may be understood by the following recitations together with the appended drawings.

BRIEF DESCRIPTION OF THE APPENDED DRAWINGS

FIG. 6 is a local cross-sectional view of another modification of the backlight apparatus according to the preferred embodiment of the invention.

DETAILED DESCRIPTION OF THE INVENTION

Figure 1:
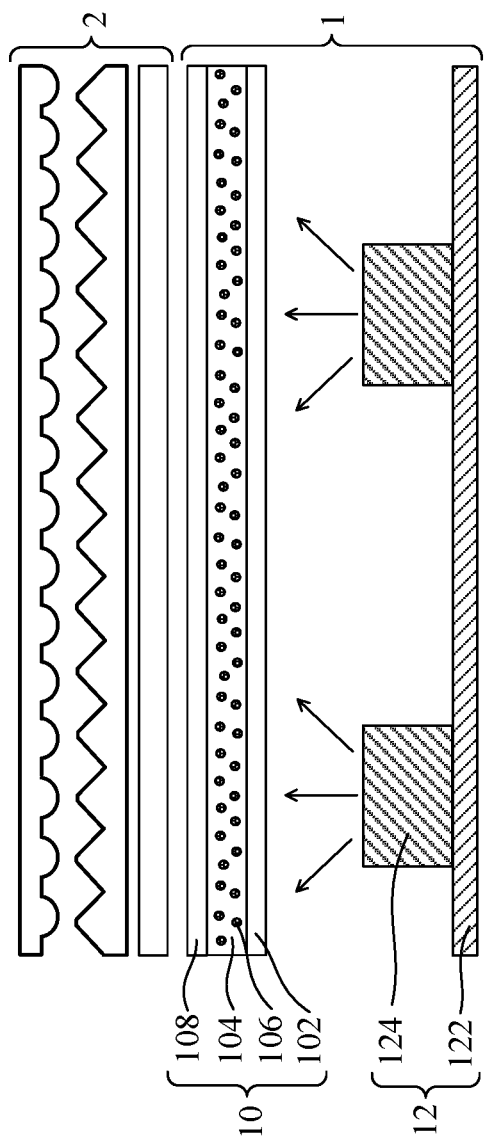
FIG. 1 is a local cross-sectional view of a direct illumination type backlight apparatus of the prior art.
Figure 2:
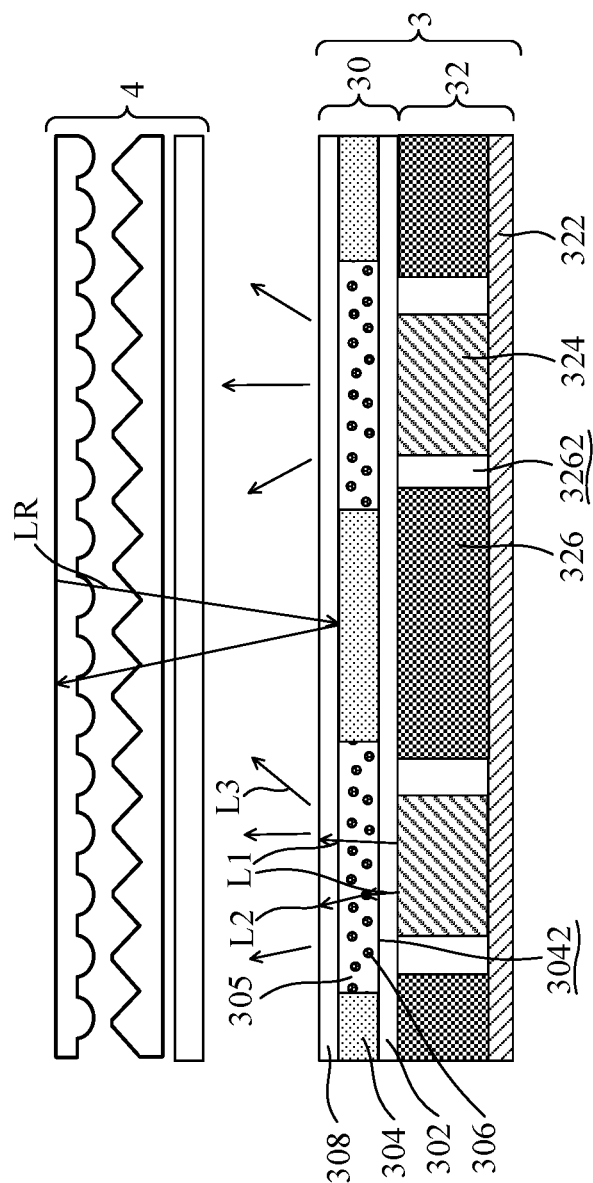
FIG. 2 is a local cross-sectional view of a backlight apparatus according to a preferred embodiment of the invention.
Figure 3:
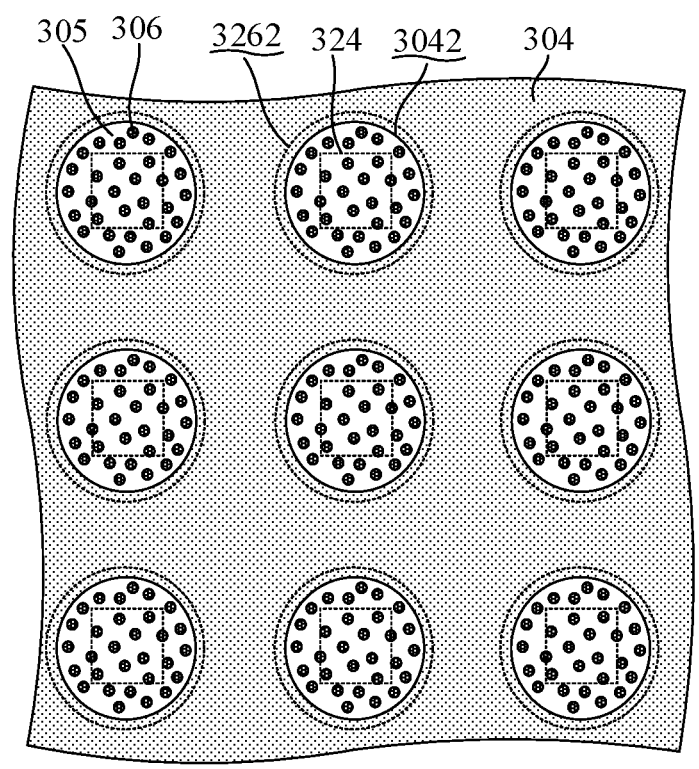
FIG. 3 is a local top view of the backlight apparatus according to the preferred embodiment of the invention.

Referring to FIGS. 2 to 6, those drawings schematically illustrate a backlight apparatus 3 according to a preferred embodiment of the invention and modifications thereof. FIGS. 2, 4 to 6 schematically illustrates with local cross-sectional views the backlight apparatus 3 according to the preferred embodiment of the invention and modifications thereof. FIG. 3 schematically illustrates with a local to view the backlight apparatus 3 according to the preferred embodiment of the invention.

As shown in FIG. 2, the backlight apparatus 3 according to the preferred embodiment of the invention includes a wavelength-converting device 30 and a light source 32. Optical films 4 disposed above the backlight apparatus 3 according to the preferred embodiment of the invention is also illustrated in FIG. 2. The optical films can include prism films, diffusion films, reflection films and so on.

The wavelength-converting device 30 includes a transparent lower barrier film 302, a first spacer layer 304, a filling material 305, a plurality of first quantum dots 306 and a transparent upper barrier film 308. The first spacer layer 304 is bonded on the transparent lower barrier film 302, and has a plurality of first hollowed regions 3042. The filling material 305 covers the plurality of first hollowed regions 3042. The plurality of first quantum dots 306 are uniformly distributed in the filling material 305 covering each first hollowed region 3042. The transparent upper barrier film 308 is bonded on the first spacer layer 304 and the filling material 305 covering the first hollowed regions 3042.

In one embodiment, the top view of each first hollowed region 3042 can be circular, square, rectangular, hexagon and so on.

In one embodiment, the transparent lower barrier film 302 and the transparent upper barrier film 308 can be formed of a polymer material, such as polyethylene terephthalate (PET), polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxy, silica glass, silica gel, siloxane, polyphosphate, hydrogel, agarose, cellulose, etc.

The light source 32 includes a circuit board 322 and a plurality of semiconductor light-emitting devices 324.

The circuit board 322 is disposed beneath the transparent lower barrier film 302. Each first hollowed region 3042 corresponds to at least one semiconductor light-emitting device 324. In the example shown in FIG. 2, each first hollowed region 3042 corresponds to one semiconductor light-emitting device 324.

Each semiconductor light-emitting device 324 is electrically bonded on the circuit board 322, and locates beneath the corresponding first hollowed region 3042. Each semiconductor light-emitting device 324 emits a first color light passing through the filling material 305 covering the corresponding first hollowed region 3042. The first quantum dots 306 distributed in the filling material 305 covering each fist hollowed region absorb a first portion of the first color light L1 passing through the filling material 305, and convert the absorbed first portion of the first color light L1 into a second color light L2. The second color light L2 is blended with other portion of the first color light L1 into a third color light L3 propagating toward the transparent upper barrier film 308. Obviously, distinguishable from the prior arts, the first color quantum dots 306 used within the backlight apparatus 3 of the invention are only locally distributed in the wavelength-converting device 30, so the first color quantum dots 306 are used in a small amount.

In one embodiment, the plurality of semiconductor light-emitting devices 324 can be, but not limited to, GaN-based diode dies or packaged devices. The first color light L1 emitted by the plurality of semiconductor light-emitting devices 324 can be, but not limited to, blue light or violet light.

In one embodiment, the plurality of first quantum dots 306 can be formed of a first group II-VI compound, a fist group III-V compound, a first group IV-VI compound, a first group IV compound, or a mixture therebetween In one embodiment, the first group II-VI compound applied in the invention to form the first quantum dots 306 can be CdSe, CdTe, ZnS, ZnSe, ZnTe, ZnO, HgS, HgSe, HgTe, CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or other group II-VI compound.

In one embodiment, the first group III-V compound applied in the invention to form the first quantum dots 306 can be GaN, GaP, GaAs, GaSb, AN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or other group III-V compound.

In one embodiment, the first group IV-VI compound applied in the invention to form the first quantum dots 306 can be SnS, SnSe, SnTe, PbS, PbSe, PbTe, SnSeS, SnSeTe, SnالسTe, PbSeS, PbSeTe, PbSTe, SnPbS, SnPbSe, SnPbTe, SnPbSSe, SnPbSeTe, SnPbSTe, or other group IV-VI compound.

In one embodiment, the first group IV compound applied in the invention to form the first quantum dots 306 can be Si, Ge, SiC, SiGe, or other group IV compound.

Also as shown in FIG. 2, further, the backlight apparatus 3 according to the invention also includes a second spacer layer 326. The second spacer layer 326 is mounted on the circuit board 322, and has a plurality of second hollowed regions 3262. Each second hollowed region 3262 corresponds to one of the first hollowed regions 3042, and locates beneath the corresponding first hollowed region 3042. The at least one semiconductor light-emitting device 324 corresponding to each first hollowed region 3042 is disposed within the second hollowed region 3262 corresponding said one first hollowed region 3042.

In one embodiment, the shape exhibited by the top view of each second hollowed region 3262 is identical to the shape exhibited by the top view of each first hollowed region 3042. The size of the shape exhibited by the top view of each second hollowed region 3262 can be larger, equal to, or smaller than the size of the shape exhibited by the top view of each first hollowed region 3042.

Referring to FIG. 3, FIG. 3 schematically illustrates with a local to view the backlight apparatus 3 according to the preferred embodiment of the invention. In FIG. 3, the transparent upper barrier film 308 is removed. In the example shown in FIG. 3, the top view of each first hollowed region 3042 exhibits a circle. The top view of each second hollowed region 3262 also exhibits a circle. Each second hollowed region 3262 locates beneath the corresponding first hollowed region 3042. The filling material 305 is filled in and covers each first hollowed regions 3042. Each semiconductor light-emitting device 324 is disposed within the corresponding second hollowed region 3262.

Also as shown in FIG. 2, the transparent lower barrier film 302 is mounted on the second spacer layer 326. Moreover, in particular, the concentration of the first quantum dots 306 distributed in the fill material 305 is relatively concentrated as compared to the concentration of the quantum dots 106 distributed in the transparent intermediate layer 104 of the prior art.

The light emitted by the light source 32 passes through the wavelength-converting device 30 and is partially reflected by the optical films 4. As shown in FIG. 2, when the light LR reflected by the optical films 4 is incident on the filling material 305, the light LR is reflected by the filling material 305 due to the denser concentration of the first color quantum dots 306 distributed in the filling material 305. Also, because the transparent lower barrier film 302 is mounted on the second spacer layer 326, the first color light L1 emitted by the semiconductor light-emitting devices 324 is more likely to directly pass through the filling material 305.

In one embodiment, the first spacer layer 304 can be formed of a transparent polymer material. The second spacer layer 326 can be formed of a light colored polymer material of a metal sheet. If the light LR reflected by the optical films 4 passes through the transparent first spacer layer 304, the light LR will be reflected by the second spacer layer 326 and cannot pass through the filling material 305 again.

In another embodiment, the first spacer layer 304 can be formed of a dark colored polymer material. If the light LR reflected by the optical films 4 is incident on the dark colored first spacer layer 304, the light LR will be shielded or absorbed by the first spacer layer 304.

In another embodiment, the first spacer layer 304 can be formed of a light colored polymer material or a metal sheet. If the light LR reflected by the optical films 4 is incident on the light colored first spacer layer 304, the light LR will be reflected by the first spacer layer 304, as shown in FIG. 2.

With above detailed description of the preferred embodiments, it is believed that the backlight apparatus 3 according to the preferred embodiment of the invention does not cause a portion of the light emitted from the light source 32 to repeatedly pass through the wavelength-converting device 30. Moreover, the color of the light that eventually passing through the optical films 4 will not be biased toward the color of the light which original light is converted by the first quantum dot 306 into. The backlight apparatus 3 of the invention has no problem of color deviation.

Figure 4:
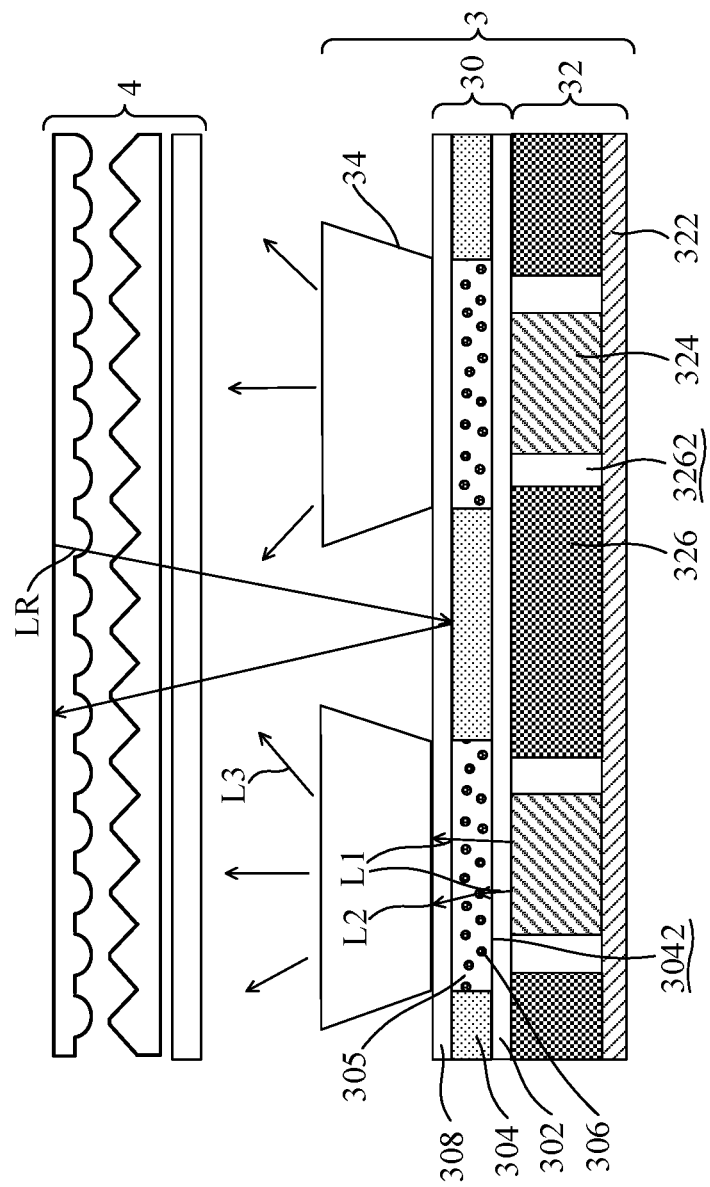
FIG. 4 is a local cross-sectional view of a modification of the backlight apparatus according to the preferred embodiment of the invention.

As shown in FIG. 4, further, the backlight apparatus 3 according to the preferred embodiment of the invention also includes a plurality of first lens devices 34. Each first lens device 34 corresponds to one of the first hollowed regions 3042, is mounted on the transparent upper barrier film 308, and locates above the corresponding first hollowed region 3042. The first lens devices 34 can disperse the light emitted from the filling material 305. The components and devices in FIG. 4 identical to those shown in FIG. 2 are given the same numerical notations, and will be not described in detail herein.

Figure 5:
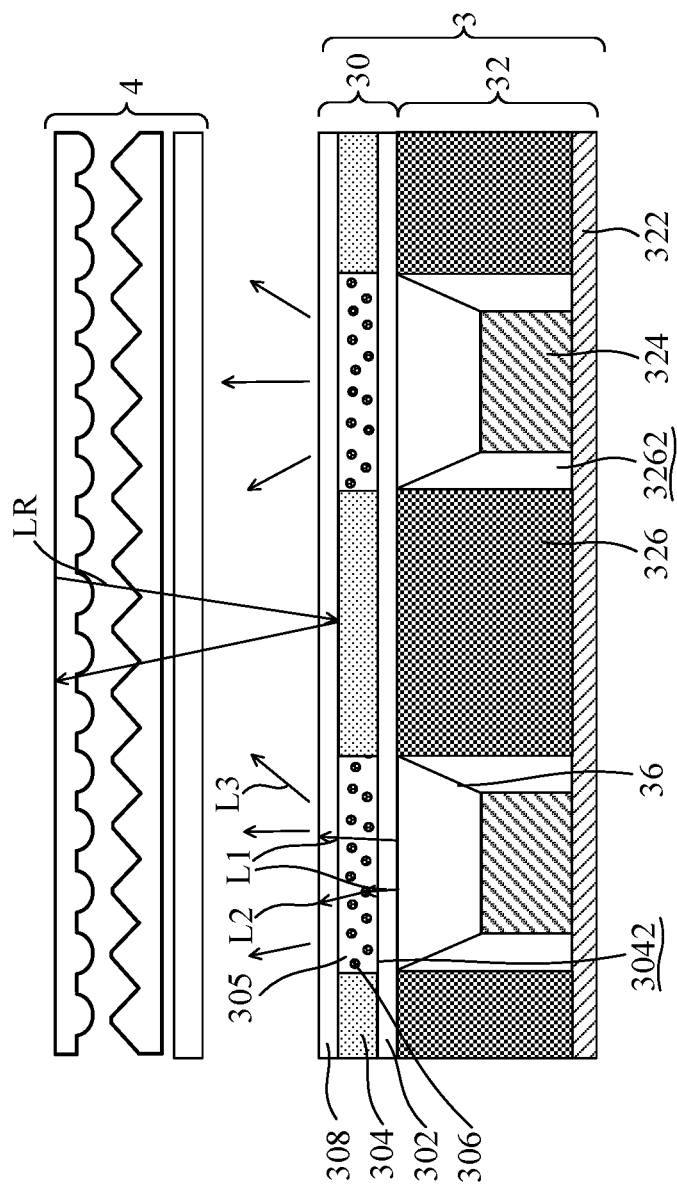
FIG. 5 is a local cross-sectional view of another modification of the backlight apparatus according to the preferred embodiment of the invention.

As shown in FIG. 5, further, the backlight apparatus 3 according to the preferred embodiment of the invention also includes a plurality of second lens devices 36. Each second lens device 36 corresponds to one of the second hollowed regions 3262, is disposed within the corresponding second hollowed region 3262, and locates above the semiconductor light-emitting devices 324 in the corresponding second hollowed region 3262. The second lens devices 36 can disperse the first color light L1 emitted by the semiconductor light-emitting devices 324. The components and devices in FIG. 5 identical to those shown in FIG. 2 are given the same numerical notations, and will be not described in detail herein. The backlight apparatus 3 according to the preferred embodiment of the invention can simultaneously configure the first lens devices 34 and the second lens devices 36.

As shown in FIG. 6, further, the backlight apparatus 3 according to the invention also includes a plurality of second quantum dots 307. The plurality of second quantum dots 307 are uniformly distributed in the filling material 305 covering each first hollowed region 3042. The second quantum dots 307 distributed in the filling material 305 covering each first hollowed region 3042 absorb a second portion of the first color light L1 passing through the filling material 305, and convert the absorbed second portion of the first color light L1 into a fourth color light L4. The fourth color light L4 is blended with the second color light L2 and other portion of the first color light L1 into a fifth color light L5 propagating toward the transparent upper barrier film 308. The components and devices in FIG. 6 identical to those shown in FIG. 2 are given the same numerical notations, and will be not described in detail herein. In one embodiment, the first quantum dots can be red quantum dots, and the second quantum dots can be green quantum dots.

In one embodiment, the plurality of second quantum dots 307 can be formed of a second group II-VI compound, a second group III-V compound, a second group IV-VI compound, a second group IV compound, or a mixture therebetween.

In one embodiment, the second group II-VI compound applied in the invention to form the second quantum dots 307 can be CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, other group II-VI compound.

In one embodiment, the second group III-V compound applied in the invention to form the second quantum dots 307 can be GaN, GaP, GaAs, GaSb, AN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or other group III-V compound.

In one embodiment, the second group IV-VI compound applied in the invention to form the second quantum dots 307 can be SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, or other group IV-VI compound.

In one embodiment, the second group IV compound applied in the invention to form the second quantum dots 307 can be Si, Ge, SiC, SiGe, or other group IV compound.

With above detailed description of the preferred embodiments, it is believed that the invention differs from the prior arts in that the backlight apparatus of the invention employs a small amount of quantum dots and has no color deviation problems caused by the backlight apparatuses of the prior arts.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A backlight apparatus, comprising:
   a wavelength-converting device, comprising:
   a transparent upper barrier film;
   a transparent lower barrier film;
   a first spacer layer, being bonded on the transparent lower barrier film, and having a plurality of first hollowed regions;
   a filling material, covering the plurality of first hollowed regions; and
   a plurality of first quantum dots, uniformly distributed in the filling material covering each first hollowed region; and
   a light source, comprising:
   a circuit board, disposed beneath the transparent lower barrier film; and
   a plurality of semiconductor light-emitting devices, wherein each first hollowed region corresponds to at least one semiconductor light-emitting device, each semiconductor light-emitting device is electrically bonded on the circuit board, and locates beneath the corresponding first hollowed region, each semiconductor light-emitting device emits a first color light passing through the filling material covering the corresponding first hollowed region;

wherein the first quantum dots distributed in the filling material covering each fist hollowed region absorb a first portion of the first color light passing through said filling material, and convert the absorbed first portion of the first color light into a second color light, the second color light is blended with other portion of the first color light into a third color light propagating toward the transparent upper barrier film.

2. The backlight apparatus of claim 1, further comprising:
a second spacer layer, being mounted on the circuit board, and having a plurality of second hollowed regions, each second hollowed region corresponding to one of the first hollowed regions and locating beneath the corresponding first hollowed region, the at least one semiconductor light-emitting device corresponding to each first hollowed region being disposed within the second hollowed region corresponding said one first hollowed region.

3. The backlight apparatus of claim 2, wherein the transparent lower barrier film is mounted on the second spacer layer.

4. The backlight apparatus of claim 3, further comprising:
a plurality of first lens devices, each first lens device corresponding to one of the first hollowed regions, being mounted on the transparent upper barrier film, and locating above the corresponding first hollowed region.

5. The backlight apparatus of claim 3, further comprising:
a plurality of second lens devices, each second lens device corresponding to one of the second hollowed regions, being disposed within the corresponding second hollowed region, and locating above the semiconductor light-emitting devices in the corresponding second hollowed region.

6. The backlight apparatus of claim 3, wherein the plurality of first quantum dots are formed of one selected from the group consisting of a first group II-VI compound, a fist group III-V compound, a first group IV-VI compound, a first group IV compound, and a mixture therebetween, the first group II-VI compound is one selected from the group consisting of CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe, the first group III-V compound is one selected from the group consisting of GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAl-PAs, GaAlPSb, GaInNP, GaInNAs, GaInNSb, GaInPAs, GaInPSb, InAlNP, InAlNAs, InAlNSb, InAlPAs, and InAlPSb, the first group IV-VI compound is one selected the group consisting of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, and SnPbSTe, the first group IV compound is one selected from the group consisting of Si, Ge, SiC and SiGe.

7. The backlight apparatus of claim 3, further comprising:
a plurality of second quantum dots, uniformly distributed in the filling material covering each first hollowed region; wherein the second quantum dots distributed in the filling material covering each fist hollowed region absorb a second portion of the first color light passing through said filling material, and convert the absorbed second portion of the first color light into a fourth color light, the fourth color light is blended with the second color light and other portion of the first color light into a fifth color light propagating toward the transparent upper barrier film.

8. The backlight apparatus of claim 7, wherein the plurality of second quantum dots are formed of one selected from the group consisting of a second group II-VI compound, a second group III-V compound, a second group IV-VI compound, a second group IV compound, and a mixture therebetween, the second group II-VI compound is one selected from the group consisting of CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe, the second group III-V compound is one selected from the group consisting of GaN, GaP, GaAs, GaSb, AN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb, the second group IV-VI compound is one selected the group consisting of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, and SnPbSTe, the second group IV compound is one selected from the group consisting of Si, Ge, SiC and SiGe.

9. The backlight apparatus of claim 3, wherein the first spacer layer is formed of a transparent polymer material or a dark colored polymer material.

10. The backlight apparatus of claim 3, wherein the first spacer layer is formed of a first light colored polymer material or a first metal sheet, the second spacer layer is formed of a second light colored polymer material or a second metal sheet.

* * * * *